(12) United States Patent
Matsuda et al.

(10) Patent No.: US 9,007,501 B2
(45) Date of Patent: Apr. 14, 2015

(54) SOLID-STATE IMAGING APPARATUS AND IMAGING SYSTEM

(75) Inventors: Takashi Matsuda, Yokohama (JP); Shin Kikuchi, Isehara (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 370 days.

(21) Appl. No.: 13/159,502

(22) Filed: Jun. 14, 2011

(65) Prior Publication Data

US 2012/0008029 A1   Jan. 12, 2012

(30) Foreign Application Priority Data

Jul. 7, 2010   (JP) .................................. 2010-155260

(51) Int. Cl.
| | |
|---|---|
| *H04N 3/14* | (2006.01) |
| *H04N 5/335* | (2011.01) |
| *H01L 27/146* | (2006.01) |
| *H04N 5/32* | (2006.01) |
| *H04N 5/341* | (2011.01) |
| *H04N 5/3745* | (2011.01) |

(52) U.S. Cl.
CPC .... *H01L 27/14609* (2013.01); *H01L 27/14623* (2013.01); *H04N 5/32* (2013.01); *H04N 5/3415* (2013.01); *H04N 5/3745* (2013.01); *H01L 27/14643* (2013.01); *H01L 27/14663* (2013.01)
USPC .......................................... 348/302; 348/294

(58) Field of Classification Search
CPC ................... H01L 27/14638; H01L 27/14643; H01L 27/14663; H04N 5/3745
USPC .......................................... 348/294, 300–302
See application file for complete search history.

(56) References Cited

U.S. PATENT DOCUMENTS

| | | | |
|---|---|---|---|
| 3,364,822 A | 1/1968 | Gutkowski | |
| 4,386,327 A | 5/1983 | Ogawa | |
| 4,954,895 A | 9/1990 | Akimoto et al. | ......... 358/213.11 |
| 5,120,199 A | 6/1992 | Youngs et al. | |
| 5,245,203 A | 9/1993 | Morishita et al. | |

(Continued)

FOREIGN PATENT DOCUMENTS

| | | |
|---|---|---|
| CN | 1604655 A | 4/2005 |
| CN | 1697493 A | 11/2005 |

(Continued)

OTHER PUBLICATIONS

Pending Unpublished U.S. Appl. No. 13/945,580; Inventor: Yu Arishima, et al.; Filing Date: Jul. 18, 2013. (Pursuant to 1287 Off. Gaz. Pat. Office 163, a copy of this application is not included because the application is stored in the IFW system.).

*Primary Examiner* — Chia-Wei A Chen

(74) *Attorney, Agent, or Firm* — Fitzpatrick, Cella, Harper & Scinto

(57) ABSTRACT

A solid-state imaging apparatus includes a pixel array in which a plurality of pixels are arranged, wherein the pixel array has a region formed from one of an electrical conductor and a semiconductor to which a fixed electric potential is supplied, each pixel includes a photoelectric converter, a charge-voltage converter which converts charges generated by the photoelectric converter into a voltage, and an amplification unit which amplifies a signal generated by the charge-voltage converter by a positive gain and outputs the amplified signal to an output line, and the output line comprising a shielding portion arranged to shield at least part of the charge-voltage converter with respect to the region.

6 Claims, 12 Drawing Sheets

(56) References Cited

U.S. PATENT DOCUMENTS

| | | | |
|---|---|---|---|
| 5,352,920 A | 10/1994 | Morishita et al. | |
| 5,506,430 A | 4/1996 | Ohzu | 257/292 |
| 6,057,586 A | 5/2000 | Bawolek et al. | 257/435 |
| 6,211,509 B1 | 4/2001 | Inoue et al. | |
| 6,239,839 B1 | 5/2001 | Matsunaga et al. | 348/308 |
| 6,384,396 B1 | 5/2002 | Mizuno et al. | |
| 6,590,242 B1 | 7/2003 | Kozuka et al. | |
| 6,649,951 B2 | 11/2003 | Kozuka et al. | |
| 6,707,498 B1 | 3/2004 | Toma et al. | |
| 6,780,666 B1 | 8/2004 | McClure | 438/57 |
| 6,878,977 B1 | 4/2005 | Kozuka et al. | |
| 6,900,480 B2 | 5/2005 | Sugiyama | 257/222 |
| 6,906,332 B2 | 6/2005 | Tashiro et al. | |
| 6,906,793 B2 | 6/2005 | Bamji et al. | 356/141.1 |
| 6,960,751 B2 | 11/2005 | Hiyama et al. | |
| 6,965,135 B2 | 11/2005 | Sugiyama | 257/222 |
| 6,969,877 B2 | 11/2005 | Sugiyama | 257/222 |
| 6,974,980 B2 | 12/2005 | Sugiyama | 257/222 |
| 7,016,089 B2 | 3/2006 | Yoneda et al. | |
| 7,071,980 B2 | 7/2006 | Yuki et al. | |
| 7,106,843 B1 | 9/2006 | Gainsboro et al. | |
| 7,151,305 B2 | 12/2006 | Kozuka et al. | |
| 7,235,831 B2 | 6/2007 | Kozuka et al. | |
| 7,288,428 B2* | 10/2007 | Muramatsu | 438/70 |
| 7,321,110 B2 | 1/2008 | Okita et al. | |
| 7,348,615 B2 | 3/2008 | Koizumi | |
| 7,408,210 B2 | 8/2008 | Ogura et al. | |
| 7,427,789 B2* | 9/2008 | Muramatsu | 257/291 |
| 7,429,764 B2 | 9/2008 | Koizumi et al. | |
| 7,446,357 B2* | 11/2008 | McKee | 257/292 |
| 7,456,888 B2 | 11/2008 | Kikuchi | |
| 7,460,162 B2 | 12/2008 | Koizumi et al. | |
| 7,470,893 B2* | 12/2008 | Suzuki et al. | 250/239 |
| 7,547,871 B2 | 6/2009 | Hiyama et al. | |
| 7,550,793 B2 | 6/2009 | Itano et al. | |
| 7,554,591 B2 | 6/2009 | Kikuchi et al. | |
| 7,557,846 B2 | 7/2009 | Ohkawa | |
| 7,557,847 B2 | 7/2009 | Okita et al. | |
| 7,564,037 B2 | 7/2009 | Tashiro et al. | |
| 7,623,056 B2 | 11/2009 | Yamashita | |
| 7,633,539 B2 | 12/2009 | Yamashita | 348/294 |
| 7,679,658 B2 | 3/2010 | Sakurai et al. | |
| 7,745,860 B2* | 6/2010 | Inoue et al. | 257/292 |
| 7,755,688 B2 | 7/2010 | Hatano et al. | |
| 7,808,537 B2 | 10/2010 | Fujimura et al. | 348/300 |
| 7,817,199 B2 | 10/2010 | Yamashita et al. | 348/308 |
| 7,842,927 B2 | 11/2010 | Tashiro et al. | |
| 7,847,259 B2 | 12/2010 | Tashiro et al. | |
| 7,852,393 B2 | 12/2010 | Kikuchi et al. | 348/308 |
| 7,859,587 B2 | 12/2010 | Katsuno et al. | 348/340 |
| 7,907,196 B2 | 3/2011 | Ogura et al. | |
| 7,916,195 B2 | 3/2011 | Kudoh | 348/294 |
| 7,928,477 B2 | 4/2011 | Kobayashi et al. | |
| 7,948,540 B2 | 5/2011 | Ogura et al. | |
| 7,952,077 B2 | 5/2011 | Tashiro et al. | |
| 7,961,237 B2 | 6/2011 | Hatano et al. | 348/300 |
| 8,164,126 B2* | 4/2012 | Moon et al. | 257/292 |
| 8,222,682 B2* | 7/2012 | Watanabe et al. | 257/292 |
| 8,253,214 B2 | 8/2012 | Guidash et al. | |
| 8,269,872 B2 | 9/2012 | Okumura | 348/308 |
| 8,279,313 B2* | 10/2012 | Rhodes | 348/308 |
| 8,293,565 B2 | 10/2012 | Ootake | 438/73 |
| 8,330,195 B2 | 12/2012 | Venezia et al. | 257/294 |
| 8,411,157 B2 | 4/2013 | Gomi et al. | 348/220.1 |
| 8,462,252 B2* | 6/2013 | Wada | 348/312 |
| 8,508,642 B2 | 8/2013 | Tanaka | 348/308 |
| 8,525,906 B2 | 9/2013 | Ui | 348/294 |
| 8,569,805 B2 | 10/2013 | Sugawa et al. | |
| 8,670,056 B2 | 3/2014 | Kono et al. | |
| 2001/0013901 A1 | 8/2001 | Matsunaga et al. | 348/308 |
| 2002/0024606 A1 | 2/2002 | Yuki et al. | |
| 2002/0050940 A1 | 5/2002 | Sato et al. | 341/155 |
| 2002/0149688 A9 | 10/2002 | Matsunaga et al. | 348/308 |
| 2002/0163583 A1 | 11/2002 | Jones | 348/272 |
| 2003/0160887 A1 | 8/2003 | Takahashi | 348/350 |
| 2003/0164887 A1 | 9/2003 | Koizumi et al. | 348/308 |
| 2003/0169360 A1 | 9/2003 | Rhodes | 348/308 |
| 2004/0130757 A1 | 7/2004 | Mabuchi | |
| 2004/0169751 A1 | 9/2004 | Takemura et al. | 348/294 |
| 2004/0178349 A1 | 9/2004 | Kameshima | |
| 2005/0018065 A1 | 1/2005 | Tashiro et al. | 348/308 |
| 2005/0032281 A1 | 2/2005 | McClure | |
| 2005/0127415 A1 | 6/2005 | Yuzurihara et al. | 257/292 |
| 2005/0179796 A1 | 8/2005 | Okita et al. | |
| 2005/0231656 A1 | 10/2005 | den Boer et al. | 349/42 |
| 2005/0237405 A1 | 10/2005 | Ohkawa | |
| 2005/0253945 A1 | 11/2005 | Shinohara | 348/300 |
| 2006/0082669 A1 | 4/2006 | Inoue et al. | 348/308 |
| 2006/0170802 A1 | 8/2006 | Misawa | |
| 2006/0187329 A1 | 8/2006 | Panicacci | 348/308 |
| 2006/0243883 A1 | 11/2006 | Yahazu et al. | 250/208.1 |
| 2006/0273353 A1 | 12/2006 | Guidash et al. | |
| 2007/0070274 A1 | 3/2007 | Yu et al. | 349/114 |
| 2007/0109437 A1 | 5/2007 | Funaki et al. | 348/308 |
| 2007/0205354 A1 | 9/2007 | Li | 250/208.1 |
| 2007/0258000 A1 | 11/2007 | Kondo | 348/308 |
| 2007/0290143 A1* | 12/2007 | Kameshima et al. | 250/370.09 |
| 2008/0068480 A1 | 3/2008 | Okita et al. | 348/294 |
| 2008/0170143 A1 | 7/2008 | Yoshida | |
| 2008/0273093 A1 | 11/2008 | Okita et al. | |
| 2008/0283884 A1 | 11/2008 | Park | |
| 2009/0027529 A1* | 1/2009 | Jung et al. | 348/294 |
| 2009/0085135 A1 | 4/2009 | Bang | 257/432 |
| 2009/0134433 A1 | 5/2009 | Jung | 257/239 |
| 2009/0160983 A1* | 6/2009 | Lenchenkov | 348/294 |
| 2009/0174799 A1* | 7/2009 | Lee et al. | 348/294 |
| 2009/0201400 A1 | 8/2009 | Zhang et al. | 348/296 |
| 2009/0201406 A1 | 8/2009 | Okita et al. | |
| 2009/0218479 A1 | 9/2009 | Arishima et al. | |
| 2009/0244328 A1 | 10/2009 | Yamashita | 348/241 |
| 2009/0251578 A1 | 10/2009 | Yamashita | 348/302 |
| 2009/0284632 A1 | 11/2009 | Onuki et al. | |
| 2009/0303364 A1 | 12/2009 | Shibata et al. | 348/302 |
| 2010/0002114 A1 | 1/2010 | Ogura et al. | 348/301 |
| 2010/0039545 A1* | 2/2010 | Ishiwata | 348/308 |
| 2010/0053398 A1 | 3/2010 | Yamashita | |
| 2010/0066877 A1* | 3/2010 | Yamaguchi et al. | 348/279 |
| 2010/0078692 A1 | 4/2010 | Lim | 257/292 |
| 2010/0079635 A1 | 4/2010 | Yano et al. | 348/294 |
| 2010/0079636 A1* | 4/2010 | Aoki et al. | 348/294 |
| 2010/0084728 A1 | 4/2010 | Yamada | 257/432 |
| 2010/0148289 A1 | 6/2010 | McCarten et al. | |
| 2010/0149366 A1 | 6/2010 | Noda et al. | 348/222.1 |
| 2010/0165159 A1 | 7/2010 | Kumesawa | 348/294 |
| 2010/0165167 A1 | 7/2010 | Sugiyama et al. | |
| 2010/0182465 A1 | 7/2010 | Okita | |
| 2010/0198482 A1 | 8/2010 | Hartmann et al. | 701/103 |
| 2010/0200738 A1 | 8/2010 | Yamashita | |
| 2010/0201834 A1 | 8/2010 | Maruyama et al. | 348/222.1 |
| 2010/0225776 A1* | 9/2010 | Taura | 348/222.1 |
| 2010/0225793 A1 | 9/2010 | Matsuda et al. | |
| 2010/0231767 A1 | 9/2010 | Kikuchi | |
| 2010/0259658 A1* | 10/2010 | Konishi | 348/294 |
| 2010/0271517 A1* | 10/2010 | De Wit et al. | 348/294 |
| 2010/0291729 A1* | 11/2010 | Kawano | 438/73 |
| 2010/0309357 A1* | 12/2010 | Oike | 348/302 |
| 2010/0327148 A1 | 12/2010 | Chung et al. | 250/208.1 |
| 2010/0328302 A1 | 12/2010 | Yamashita et al. | |
| 2010/0328509 A1 | 12/2010 | Yamashita et al. | |
| 2010/0328510 A1 | 12/2010 | Hiyama et al. | |
| 2011/0001861 A1 | 1/2011 | Tanaka et al. | 348/300 |
| 2011/0007173 A1 | 1/2011 | Takenaka et al. | |
| 2011/0007196 A1* | 1/2011 | Yamashita et al. | 348/294 |
| 2011/0013062 A1 | 1/2011 | Yamashita | |
| 2011/0025892 A1* | 2/2011 | Hibbeler et al. | 348/294 |
| 2011/0025896 A1 | 2/2011 | Yamashita et al. | 348/294 |
| 2011/0032379 A1 | 2/2011 | Kobayashi et al. | |
| 2011/0032404 A1 | 2/2011 | Kikuchi | |
| 2011/0068253 A1 | 3/2011 | Arishima et al. | 250/208.1 |
| 2011/0080492 A1 | 4/2011 | Matsuda et al. | |
| 2011/0080493 A1 | 4/2011 | Kono et al. | |
| 2011/0084197 A1 | 4/2011 | Sugawa et al. | |
| 2011/0085064 A1* | 4/2011 | Nishide | 348/294 |
| 2011/0121404 A1 | 5/2011 | Shifren et al. | 257/392 |

(56) References Cited

U.S. PATENT DOCUMENTS

| | | |
|---|---|---|
| 2011/0134270 A1 | 6/2011 | Arishima et al. |
| 2011/0157441 A1 | 6/2011 | Okita et al. .................. 348/301 |
| 2011/0163407 A1 | 7/2011 | Yuzurihara et al. ........... 257/463 |
| 2011/0168872 A1 | 7/2011 | Kobayashi et al. ........ 250/208.1 |
| 2011/0169989 A1 | 7/2011 | Kono et al. |
| 2011/0175151 A1* | 7/2011 | Watanabe et al. ............. 257/291 |
| 2011/0234868 A1* | 9/2011 | Yamashita et al. ............ 348/294 |
| 2011/0242380 A1 | 10/2011 | Ogura et al. .................. 348/300 |
| 2012/0026371 A1* | 2/2012 | Itano et al. .................... 348/301 |
| 2013/0015535 A1 | 1/2013 | Yang et al. .................... 257/408 |

FOREIGN PATENT DOCUMENTS

| | | |
|---|---|---|
| CN | 1764244 A | 4/2006 |
| CN | 101043046 A | 9/2007 |
| CN | 101197386 A | 6/2008 |
| CN | 101395718 A | 3/2009 |
| CN | 101685188 A | 3/2010 |
| EP | 1930950 A2 | 6/2008 |
| JP | 01-295458 A | 11/1989 |
| JP | 03-256359 A | 11/1991 |
| JP | H04-206773 A | 7/1992 |
| JP | H06-45577 A | 2/1994 |
| JP | 07-058308 A | 3/1995 |
| JP | H11-146280 A | 5/1999 |
| JP | H11-284168 A | 10/1999 |
| JP | 2000-311997 A | 11/2000 |
| JP | 2000-312024 A | 11/2000 |
| JP | 2002-026302 A | 1/2002 |
| JP | 2002-044522 A | 2/2002 |
| JP | 2002-051262 A | 2/2002 |
| JP | 2002-090462 A | 3/2002 |
| JP | 2002-199292 A | 7/2002 |
| JP | 2002-344809 A | 11/2002 |
| JP | 2003-078827 A | 3/2003 |
| JP | 2003-218332 A | 7/2003 |
| JP | 2003-318381 A | 11/2003 |
| JP | 2003-329777 A | 11/2003 |
| JP | 2005-228956 A | 8/2005 |
| JP | 2005-317581 A | 11/2005 |
| JP | 2006-147709 A | 6/2006 |
| JP | 2006-262358 A | 9/2006 |
| JP | 2006-310933 A | 11/2006 |
| JP | 2007-081083 A | 3/2007 |
| JP | 2007-166449 A | 6/2007 |
| JP | 2007-300521 A | 11/2007 |
| JP | 2008-177191 A | 7/2008 |
| JP | 2008-543085 A | 11/2008 |
| JP | 2009-252782 A | 10/2009 |
| KR | 10-2008-0033881 A | 4/2008 |
| WO | 00/26966 A1 | 5/2000 |
| WO | 2009/146253 A1 | 12/2009 |

* cited by examiner

F I G. 4A
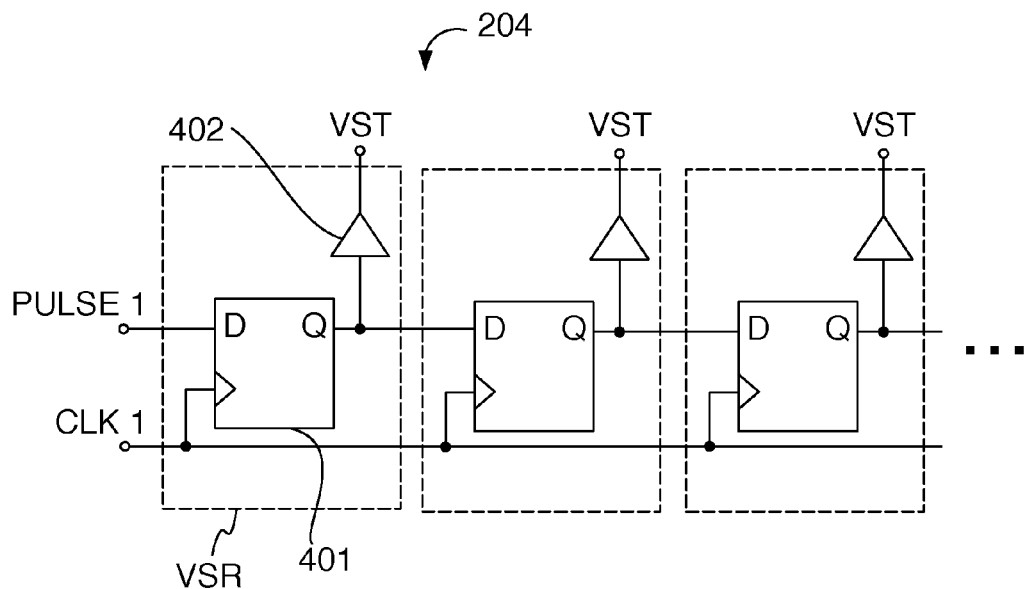
F I G. 4B
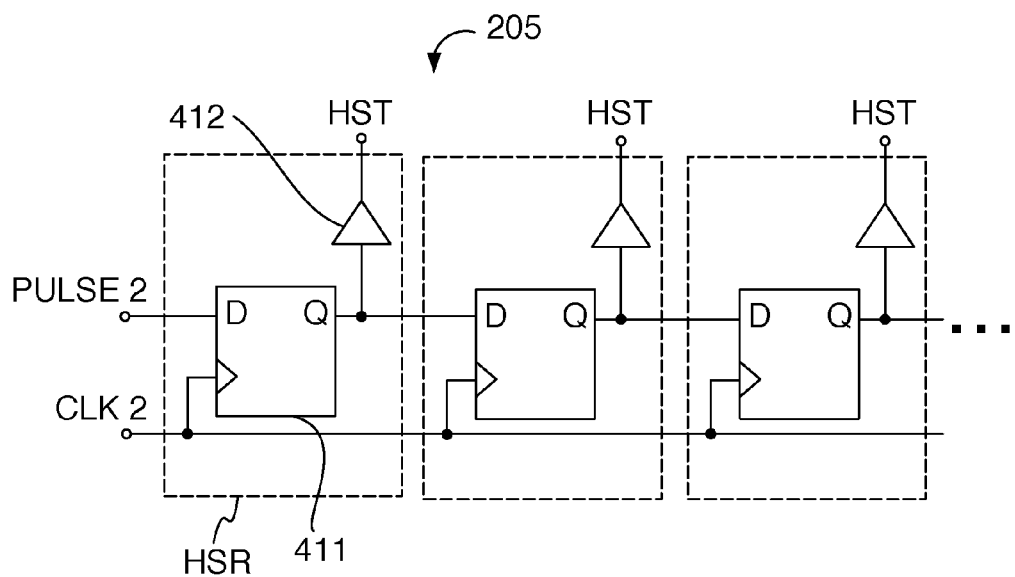

F I G. 7
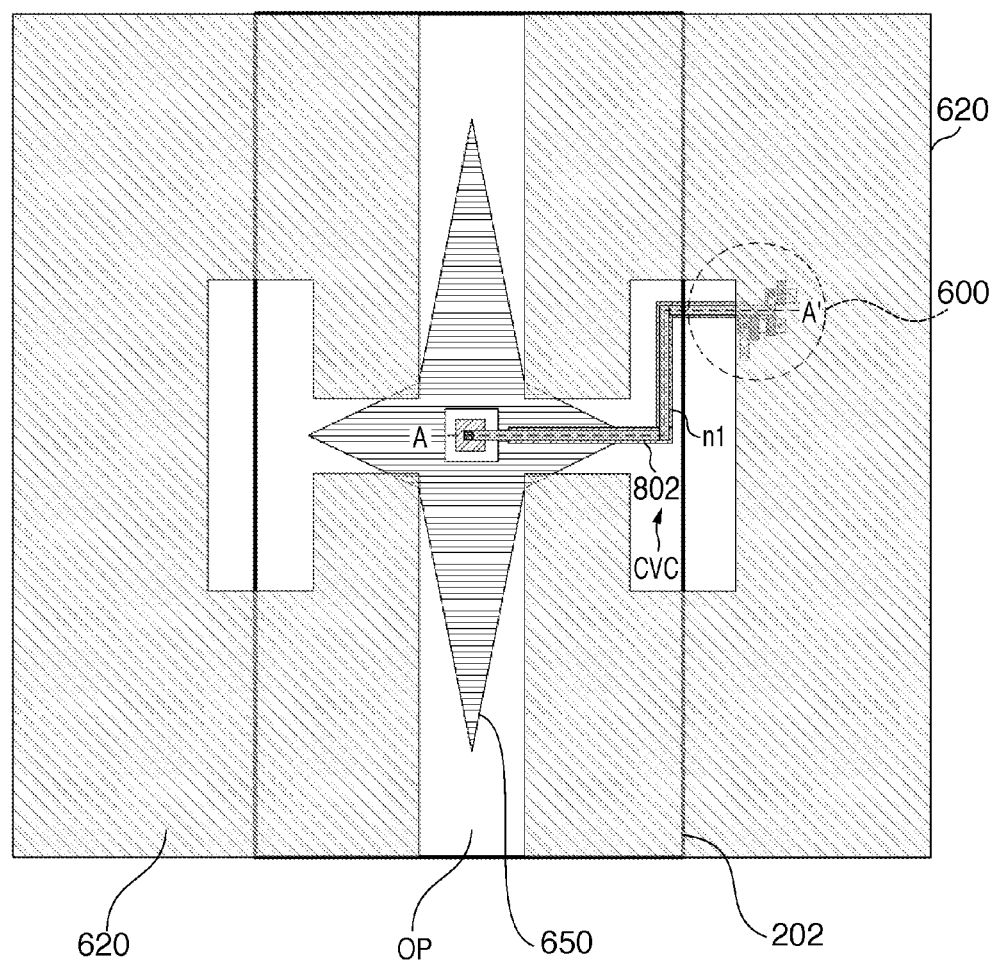

SOLID-STATE IMAGING APPARATUS AND IMAGING SYSTEM

BACKGROUND OF THE INVENTION

1. Field of the Invention

The present invention relates to a solid-state imaging apparatus and an imaging system.

2. Description of the Related Art

In a solid-state imaging apparatus, charges generated by a photoelectric converter are converted into a voltage by a charge-voltage converter such as a floating diffusion. Let Q be the charges, V be the voltage, and C be the capacity of the charge-voltage converter. Since V=Q/C, the sensitivity can be improved by reducing the capacity of the charge-voltage converter.

Japanese Patent Laid-Open No. 7-58308 discloses a solid-state imaging apparatus including a light receiving unit 1, a storage unit 2, a horizontal transfer unit 3, a floating diffusion 23, an output amplifier 27, and a buffer amplifier 31. The light receiving unit 1 includes a plurality of shift registers that are continuous in the vertical direction. The storage unit 2 includes a plurality of shift registers following those of the light receiving unit 1 and stores information charges corresponding to one screen. The horizontal transfer unit 3 receives, for each horizontal line, the information charges of one screen stored in the storage unit 2 and outputs them sequentially. The floating diffusion 23 temporarily stores the information charges output from the horizontal transfer unit 3. The floating diffusion 23 is connected to the input terminal of the output amplifier 27 via an aluminum wiring 26. The output amplifier 27 is formed from a two-stage source follower circuit. The output terminal of the output amplifier 27 is connected to the input terminal of the buffer amplifier 31. The signal output from the buffer amplifier 31 has the same phase as that of the potential variation that occurs in the floating diffusion 23, and is applied to an aluminum wiring 30 serving as a light shielding film that covers the floating diffusion 23. Hence, even when the aluminum wirings 26 and 30 oppose on both sides of an insulating film 29, the actual capacity between them is sufficiently small so as to suppress the increase in the capacity of the floating diffusion 23.

However, the invention described in Japanese Patent Laid-Open No. 7-58308 only aims at the final output portion of a CCD solid-state image sensor without considering the capacity of the charge-voltage converter of each pixel in a pixel array. Additionally, in the related-art invention, the output signal of the buffer amplifier is merely applied to the aluminum wiring to suppress the increase in the capacity of the floating diffusion caused by the aluminum wiring serving as a light shielding film that shields the floating diffusion from light. That is, in the related-art invention, the output signal of the buffer amplifier is not applied to the aluminum wiring arranged between an electrical conductor and the charge-voltage converter to suppress the increase in the capacity of the charge-voltage converter caused by the electrical conductor maintained at a fixed electric potential.

SUMMARY OF THE INVENTION

The present invention provides an advantageous technique of reducing the actual capacity of the charge-voltage converter of each pixel in a pixel array.

The first aspect of the present invention provides a solid-state imaging apparatus including a pixel array in which a plurality of pixels are arranged, the pixel array comprising a region formed from one of an electrical conductor and a semiconductor to which a fixed electric potential is supplied, each pixel comprising a photoelectric converter, a charge-voltage converter which converts charges generated by the photoelectric converter into a voltage, and an amplification unit which amplifies a signal generated by the charge-voltage converter by a positive gain and outputs the amplified signal to an output line; and the output line comprising a shielding portion arranged to shield at least part of the charge-voltage converter with respect to the region.

The second aspect of the present invention provides a solid-state imaging apparatus including a pixel array in which a plurality of pixels are arranged, the pixel array comprising a region formed from one of an electrical conductor and a semiconductor to which a fixed electric potential is supplied; and each pixel comprising a photoelectric converter, a charge-voltage converter which converts charges generated by the photoelectric converter into a voltage, and an amplification unit which amplifies a signal generated by the charge-voltage converter by a positive gain and outputs the amplified signal to an output node; wherein part of a first conductive pattern that forms the output node is arranged between at least part of the region and at least part of the charge-voltage converter.

The third aspect of the present invention provides an imaging system comprising a solid-state imaging apparatus as defined in the first or second aspect, and a processor which processes a signal output from the solid-state imaging apparatus.

Further features of the present invention will become apparent from the following description of exemplary embodiments with reference to the attached drawings.

BRIEF DESCRIPTION OF THE DRAWINGS

FIGS. 4A and 4B explain an example of the arrangements of shift registers according to the embodiment of the present invention;

FIG. 7 illustrates an example of the arrangement of a portion of an in-pixel readout circuit and a photoelectric converter;

DESCRIPTION OF THE EMBODIMENTS

Figure 1A:
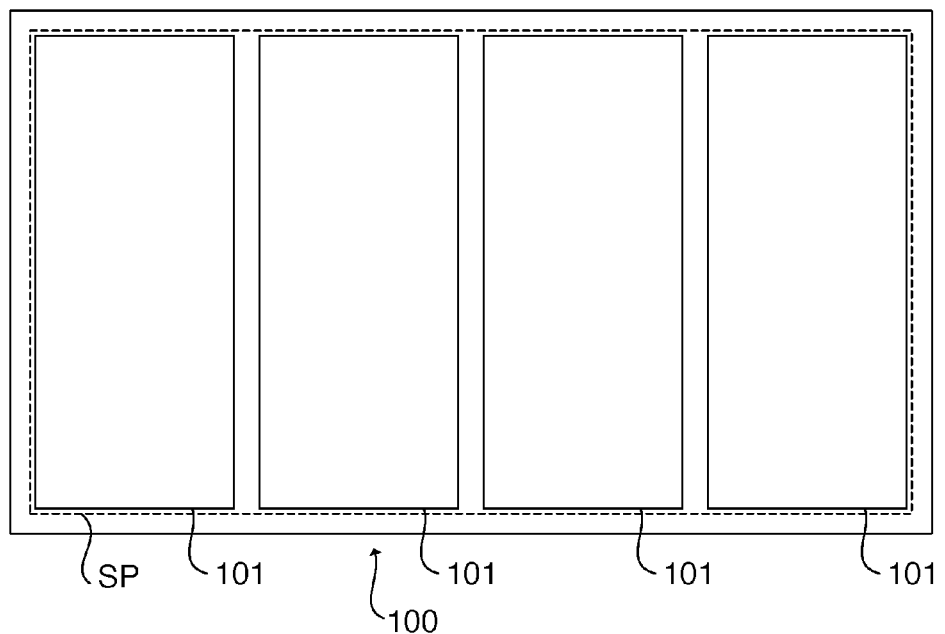
FIGS. 1A and 1B explain an example of the schematic arrangement of a solid-state imaging apparatus according to an embodiment of the present invention.
Figure 1B:
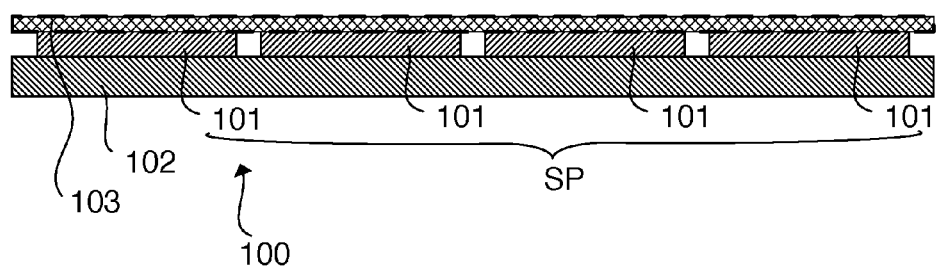

The schematic arrangement of a solid-state imaging apparatus 100 according to an embodiment of the present invention will be described with reference to FIGS. 1A and 1B. The solid-state imaging apparatus 100 can be formed by, for example, arraying a plurality of imaging blocks 101. In this case, an array of a plurality of imaging blocks 101 can form a sensor panel SP having one imaging region. The plurality of imaging blocks 101 can be arranged on a support substrate 102. When the solid-state imaging apparatus 100 uses a single imaging block 101, the single imaging block 101 forms the sensor panel SP. Each of the plurality of imaging blocks 101 may be provided by, for example, forming a circuit element on a semiconductor substrate or forming a semiconductor layer on, for example, a glass substrate and forming a circuit element on the semiconductor layer. Each of the plurality of imaging blocks 101 has a pixel array in which a plurality of pixels are arrayed so as to form pluralities of rows and columns.

The solid-state imaging apparatus 100 may serve as an apparatus which captures an image of radiation such as X-rays or an apparatus which captures an image of visible light. When the solid-state imaging apparatus 100 serves as an apparatus which captures an image of radiation, a scintillator 103 which converts radiation into visible light can typically be provided on the sensor panel SP. The scintillator 103 converts radiation into visible light, which strikes the sensor panel SP and is photoelectrically converted by each photoelectric converter on the sensor panel SP (imaging block 101).

Figure 2:
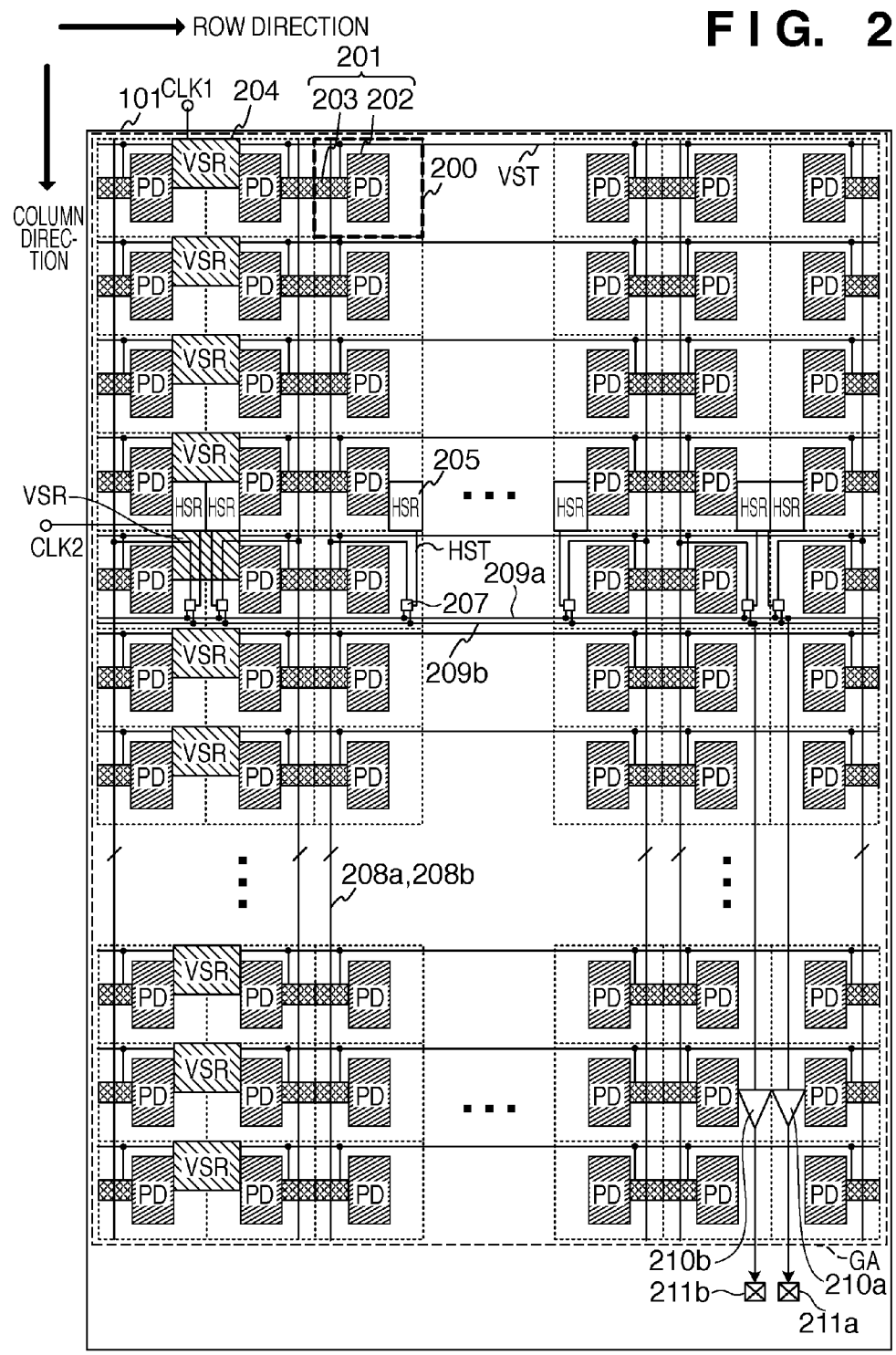
FIG. 2 explains an example of the arrangement of an imaging block according to the embodiment of the present invention.

An example of the arrangement of each imaging block 101 will be described next with reference to FIG. 2. When the solid-state imaging apparatus 100 uses a single imaging block 101, the single imaging block 101 can be regarded as a solid-state imaging apparatus. The imaging block 101 has a pixel array GA in which a plurality of pixels 201 are arrayed so as to form pluralities of rows and columns and a plurality of column signal lines 208a are arranged. Each of the plurality of pixels 201 includes a photoelectric converter (for example, a photodiode) 202, and an in-pixel readout circuit 203 which outputs a signal (light signal) corresponding to a charge generated by the photoelectric converter 202 to the column signal line 208a. In the pixel array GA, a plurality of column signal lines 208b may further be arranged, and the in-pixel readout circuit 203 can be configured to output noise generated by itself to the column signal line 208b in this case. In-pixel readout circuits 203 of two adjacent pixels 201 aligned in the row direction can be axisymmetrically arranged to have, for example, the boundary line between the two pixels 201 as their symmetry axis.

The imaging block 101 includes vertical scanning circuits 204 and horizontal scanning circuits 205. Although the vertical scanning circuit 204 can be placed, for example, between the photoelectric converters 202 on two adjacent columns, it may be placed outside the photoelectric converter 202 on the outermost column in the pixel array GA. The vertical scanning circuit 204 includes, for example, a vertical shift register which performs a shift operation in accordance with a first clock CLK1, and scans a plurality of rows in the pixel array GA in accordance with the shift operation by the vertical shift register. The vertical shift register is formed by connecting a plurality of registers in series, and a pulse received by a register in the first stage is sequentially transferred to registers in subsequent stages in accordance with the first clock CLK1. A row corresponding to a register which holds a pulse is to be selected.

Although the horizontal scanning circuit 205 can be placed, for example, between the photoelectric converters 202 on two adjacent rows, it may be placed outside the photoelectric converter 202 on the outermost row in the pixel array GA. The horizontal scanning circuit 205 includes, for example, a horizontal shift register which performs a shift operation in accordance with a second clock CLK2, and scans a plurality of columns in the pixel array GA in accordance with the shift operation by the horizontal shift register. The horizontal shift register is formed by connecting a plurality of registers in series, and a pulse received by a register in the first stage is sequentially transferred to registers in subsequent stages in accordance with the second clock CLK2. A column corresponding to a register which holds a pulse is to be selected.

The vertical scanning circuit 204 can be formed by vertically arraying a plurality of unit vertical scanning circuits VSR each including one register that constitutes the vertical shift register. Each unit vertical scanning circuit VSR can be placed in the region sandwiched by a photoelectric converter 202 of a pixel belonging to a given column (the leftmost column (that is, the first column) in FIG. 2) and a photoelectric converter 202 of a pixel belonging to a column adjacent to the given column (the second column from the left (that is, the second column) in FIG. 2). When a pulse is transferred via the vertical shift register, each unit vertical scanning circuit VSR drives a row select signal VST to active level so that pixels 201 on a row to which it belongs are selected. A light signal and noise from the pixel 201 on the selected row are output to the column signal lines 208a and 208b, respectively. Referring to FIG. 2, the column signal lines 208a and 208b are indicated by a single line. Pulse signals (start pulses) PULSE1 and PULSE2 are supplied to the input terminals (not shown) of the vertical scanning circuit 204 and horizontal scanning circuit 205, respectively.

The horizontal scanning circuit 205 can be formed by horizontally arraying a plurality of unit horizontal scanning circuits HSR each including one register that constitutes the horizontal shift register. Each unit horizontal scanning circuit HSR is placed in the region sandwiched by two photoelectric converters 202 in each pair of two adjacent pixels (a pair of pixels on the first and second columns, a pair of pixels on the third and fourth columns, . . . ) belonging to one row (the fourth row from the top (that is, the fourth row) in FIG. 2). However, each unit horizontal scanning circuit HSR is not placed in the region sandwiched by two photoelectric converters 202 in two adjacent pixels aligned in the column direction. This arrangement is advantageous to reduce the gap between the photoelectric converters 202 in the column direction. When a pulse is transferred via the horizontal shift register, each unit horizontal scanning circuit HSR controls a switch 207 so that a column to which it belongs is selected, that is, the column signal lines 208a and 208b on this column are connected to horizontal signal lines 209a and 209b, respectively. That is, a light signal and noise from the pixel 201 on the selected row are output to the column signal lines 208a and 208b, respectively, and signals from the selected column (that is, the selected column signal lines 208a and 208b) are output to the horizontal signal lines 209a and 209b. This implements X-Y addressing. The horizontal signal lines 209a and 209b are connected to the inputs of output amplifiers 210a and 210b, respectively, and signals output to the horizontal signal lines 209a and 209b are amplified by the output amplifiers 210a and 210b, respectively, and output via pads 211a and 211b, respectively.

The pixel array GA can be regarded as being obtained by arraying a plurality of unit cells 200 each including the pixel 201 so as to form pluralities of rows and columns. The unit cells 200 can include several types. A certain unit cell 200 includes at least part of the unit vertical scanning circuit VSR. Although a set of two unit cells 200 includes only one unit vertical scanning circuit VSR in the example shown in FIG. 2, one unit cell 200 may include one unit vertical scanning circuit VSR or a set of three or more unit cells 200 may include one unit vertical scanning circuit VSR. Another unit cell 200 includes at least part of the unit horizontal scanning circuit HSR. Although one unit cell 200 includes one unit horizontal scanning circuit HSR in the example shown in FIG. 2, a set of a plurality of unit cells 200 may include one unit vertical scanning circuit VSR. Still another unit cell 200 includes both at least part of the unit vertical scanning circuit VSR and at least part of the unit horizontal scanning circuit HSR. Still another unit cell 200 includes, for example, a unit cell including at least part of the output amplifier 210a, a unit cell including at least part of the output amplifier 210b, and a unit cell including the switch 207.

An example of the arrangement of each pixel 201 will be described with reference to FIG. 3. The pixel 201 includes the photoelectric converter 202 and in-pixel readout circuit 203, as described earlier. The photoelectric converter 202 can typically be a photodiode. The in-pixel readout circuit 203 can include, for example, a first amplifier circuit 310, a clamp circuit 320, a light signal sample-and-hold circuit 340, and a noise sample-and-hold circuit 360, and NMOS transistors 343 and 363 and row select switches 344 and 364 in a second amplifier circuit.

The photoelectric converter 202 includes a charge storage unit, which is connected to the gate of a PMOS transistor 303 of the first amplifier circuit 310. The source of the PMOS transistor 303 is connected to a current source 305 via a PMOS transistor 304. A first source follower circuit is formed using the PMOS transistor 303 and current source 305. Forming a source follower circuit using the PMOS transistor 303 is effective in reducing 1/f noise. The PMOS transistor 304 serves as an enable switch which enables the first source follower circuit upon being turned on when an enable signal EN supplied to its gate changes to active level. The first amplifier circuit 310 outputs a signal corresponding to the potential of a charge-voltage converter CVC to an intermediate node n1.

Figure 3:
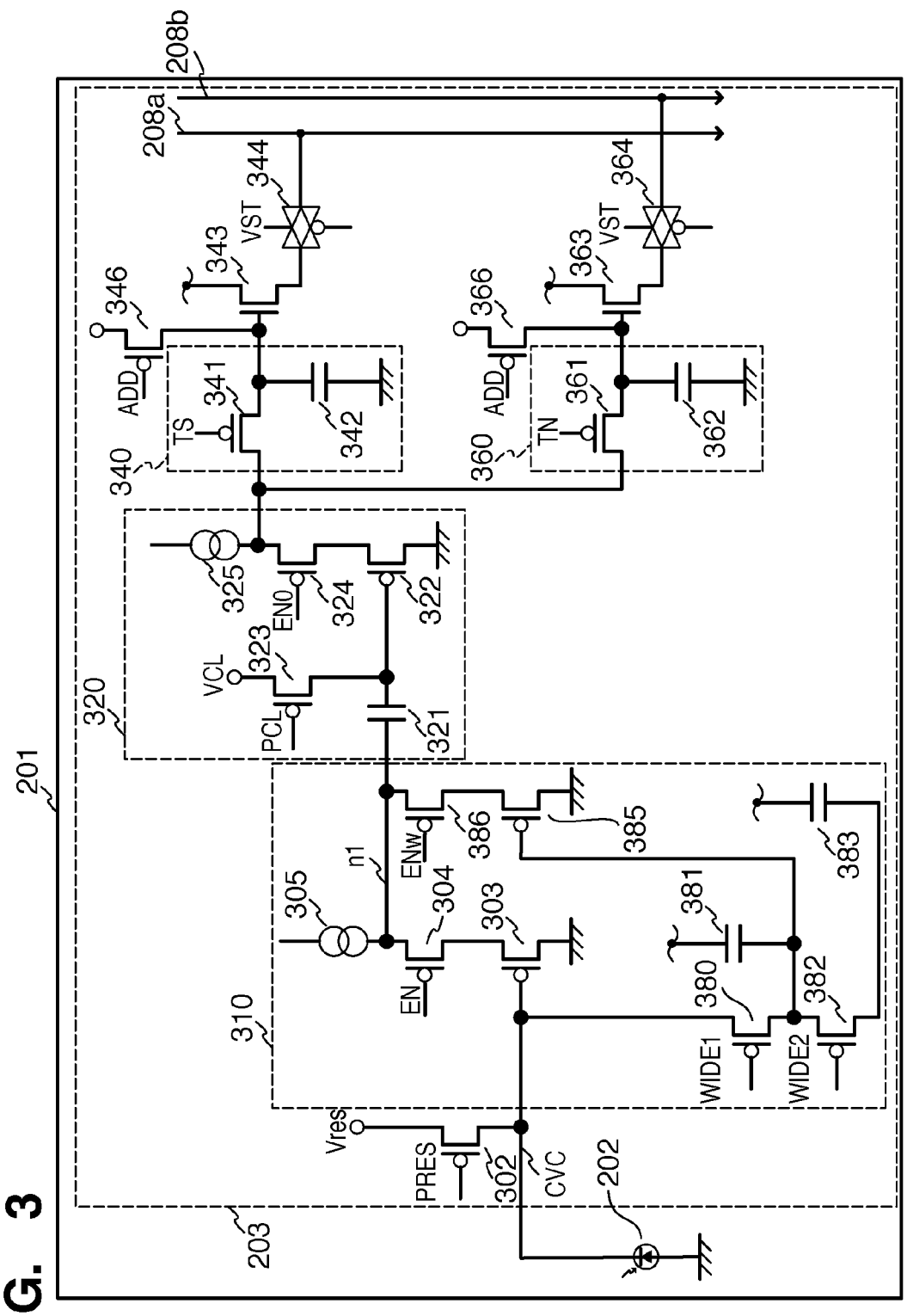
FIG. 3 explains an example of the arrangement of a pixel according to the embodiment of the present invention.

In the example shown in FIG. 3, the charge storage unit of the photoelectric converter 202 and the gate of the PMOS transistor 303 form a common node, which functions as the charge-voltage converter CVC which changes a charge stored in the charge storage unit to a voltage. That is, the charge-voltage converter CVC has the voltage V (=Q/C) determined by the charge Q stored in the charge storage unit and the capacitance value C of the charge-voltage converter CVC. The charge-voltage converter CVC is connected to a reset potential $V_{res}$ via a PMOS transistor 302 serving as a reset switch. When a reset signal PRES changes to active level, the PMOS transistor 302 is turned on, so the potential of the charge-voltage converter CVC is reset to the reset potential $V_{res}$.

The clamp circuit 320 uses a clamp capacitance 321 to clamp noise output to the intermediate node n1 by the first amplifier circuit 310 in accordance with the reset potential of the charge-voltage converter CVC. In other words, the clamp circuit 320 is a circuit for canceling that noise from a signal output from the first source follower circuit to the intermediate node n1 in accordance with the charge generated by the photoelectric converter 202. The noise output to the intermediate node n1 contains kTC noise produced upon resetting. Clamping is done by changing a clamp signal PCL to active level to turn on a PMOS transistor 323, and thereupon changing the clamp signal PCL to inactive level to turn off the PMOS transistor 323. The output terminal of the clamp capacitance 321 is connected to the gate of a PMOS transistor 322. The source of the PMOS transistor 322 is connected to a current source 325 via a PMOS transistor 324. A second source follower circuit is formed using the PMOS transistor 322 and current source 325. The PMOS transistor 324 serves as an enable switch which enables the second source follower circuit upon being turned on when an enable signal EN0 supplied to its gate changes to active level.

A signal output from the second source follower circuit in accordance with the charge generated by photoelectric conversion by the photoelectric converter 202 is written in a capacitance 342 as a light signal via a switch 341 when a light signal sampling signal TS changes to active level. A signal output from the second source follower circuit upon turning on the PMOS transistor 323 immediately after the potential of the charge-voltage converter CVC is reset is noise. This noise is written in a capacitance 362 via a switch 361 when a noise sampling signal TN changes to active level. This noise contains the offset component of the second source follower circuit.

When the unit vertical scanning circuit VSR of the vertical scanning circuit 204 drives the row select signal VST to active level, a signal (light signal) held in the capacitance 342 is output to the column signal line 208a via the NMOS transistor 343 and row select switch 344 in the second amplifier circuit. At the same time, a signal (noise) held in the capacitance 362 is output to the column signal line 208b via the NMOS transistor 363 and row select switch 364 in the second amplifier circuit. The NMOS transistor 343 in the second amplifier circuit and a constant current source (not shown) provided on the column signal line 208a form a source follower circuit. Similarly, the NMOS transistor 363 in the second amplifier circuit and a constant current source (not shown) provided on the column signal line 208b form a source follower circuit.

The pixel 201 may include an add switch 346 which adds light signals from a plurality of adjacent pixels 201. In an add mode, an add mode signal ADD changes to active level, so the add switch 346 is turned on. Thus, the add switch 346 connects the capacitances 342 of adjacent pixels 201 to each other, thereby averaging the light signals. Similarly, the pixel 201 may include an add switch 366 which adds noise signals from a plurality of adjacent pixels 201. When the add switch 366 is turned on, the add switch 366 connects the capacitances 362 of adjacent pixels 201 to each other, thereby averaging the noise signals.

The pixel 201 may have a function for changing the sensitivity. The pixel 201 can include, for example, a first sensitivity change switch 380, a second sensitivity change switch 382, and a circuit element associated with them. When a first change signal WIDE1 changes to active level, the first sensitivity change switch 380 is turned on, so the capacitance value of a first additional capacitance 381 is added to that of the charge-voltage converter CVC. This lowers the sensitivity of the pixel 201. When a second change signal WIDE2 changes to active level, the second sensitivity change switch 382 is turned on, so the capacitance value of a second additional capacitance 383 is added to that of the charge-voltage converter CVC. This further lowers the sensitivity of the pixel 201.

In this manner, adding a function of lowering the sensitivity of the pixel 201 makes it possible to receive a larger amount of light, thus widening the dynamic range. When the first change signal WIDE1 changes to active level, an enable signal $EN_w$ may be changed to active level to enable a PMOS transistor 385 to perform a source follower operation, in addition to enabling the PMOS transistor 303 to perform a source follower operation.

Although the vertical scanning circuit 204 can have various arrangements, it can have an arrangement shown in, for example, FIG. 4A. In the vertical scanning circuit 204 shown in FIG. 4A, each unit vertical scanning circuit VSR includes one D-type flip-flop 401, and the first clock CLK1 is supplied to the clock input of the D-type flip-flop 401. The first pulse signal PULSE1 is supplied to the D input of the D-type flip-flop 401 of the unit vertical scanning circuit VSR in the first stage, and received in response to the first clock CLK1. The D-type flip-flop 401 in the first stage outputs a pulse signal having a duration corresponding to one cycle of the first clock CLK1 from its Q output. The Q output of the D-type flip-flop 401 of each unit vertical scanning circuit VSR is used to select a row to which the unit vertical scanning circuit VSR belongs, and is output as a row select signal VST via, for example, a buffer 402. The Q output of the D-type flip-flop 401 of each unit vertical scanning circuit VSR is connected to the D input of the D-type flip-flop 401 of the unit vertical scanning circuit VSR in the next stage.

Although the horizontal scanning circuit 205 can have various arrangements, it can have an arrangement shown in, for example, FIG. 4B. In the horizontal scanning circuit 205 shown in FIG. 4B, each unit horizontal scanning circuit HSR includes one D-type flip-flop 411, and the second clock CLK2 is supplied to the clock input of the D-type flip-flop 411. The second pulse signal PULSE2 is supplied to the D input of the D-type flip-flop 411 of the unit horizontal scanning circuit HSR in the first stage, and received in response to the second clock CLK2. The unit horizontal scanning circuit HSR in the first stage outputs a pulse signal having a duration corresponding to one cycle of the second clock CLK2 from its Q output. The Q output of each unit horizontal scanning circuit HSR is used to select a column to which the unit horizontal scanning circuit HSR belongs, and is output as a column select signal HST via, for example, a buffer 412. The Q output of each unit horizontal scanning circuit HSR is connected to the D input of the D-type flip-flop 411 of the unit horizontal scanning circuit HSR in the next stage. Note that the vertical scanning period that is the scanning period of the vertical scanning circuit 204 is obtained by multiplying the horizontal scanning period of the horizontal scanning circuit 205 by the number of rows in the pixel array GA. The horizontal scanning period is the period of time required to scan all columns in the pixel array GA. Hence, the frequency of the second clock CLK2 supplied to the horizontal scanning circuit 205 which generates the column select signal HST used to select a column is greatly higher than that of the first clock CLK1 supplied to the vertical scanning circuit 204 which generates the row select signal VST used to select a row.

Figure 5:
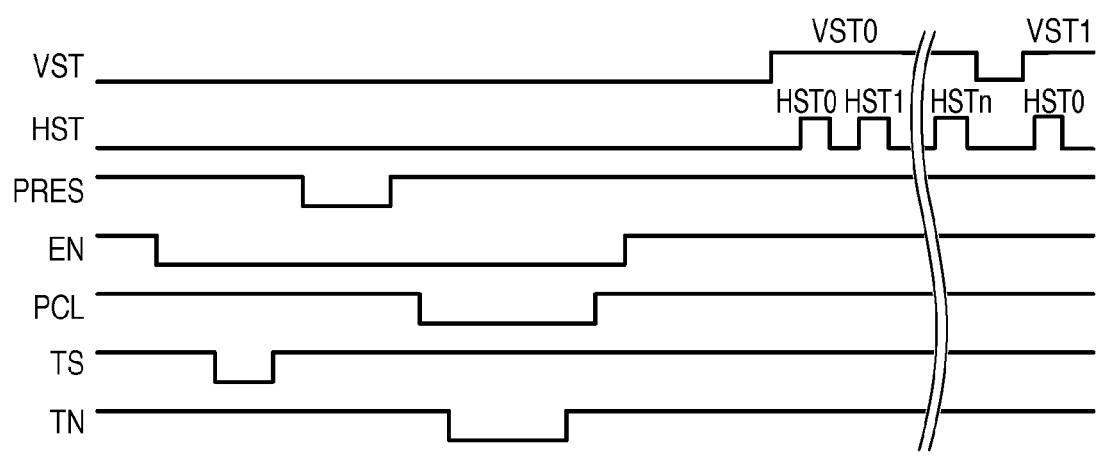
FIG. 5 explains an example of a timing chart according to the embodiment of the present invention.

Main signals supplied to each pixel 201 will be described with reference to FIG. 5. The reset signal PRES, enable signal EN, clamp signal PCL, light signal sampling signal TS, and noise sampling signal TN are low-active signals. Although not shown in FIG. 5, the enable signal EN0 can be a signal similar to the enable signal EN. Also, although not shown in FIG. 5, the enable signal $EN_w$ can make a transition in the same way as in the enable signal EN when the first change signal WIDE1 becomes active.

First, the enable signal EN becomes active on all rows in the pixel array GA, and the light signal sampling signal TS changes to active level in a pulsed pattern, so a light signal is written in the capacitance 342. Next, the reset signal PRES changes to active level in a pulsed pattern, so the potential of the charge-voltage converter CVC is reset. The clamp signal PCL changes to active level in a pulsed pattern. When the clamp signal PCL is at active level, the noise sampling signal TN changes to active level in a pulsed pattern, so noise is written in the capacitance 362.

A unit vertical scanning circuit VSR corresponding to the first row of the vertical scanning circuit 204 changes its row select signal VST (VST0) to active level. This means that the vertical scanning circuit 204 selects the first row of the pixel array GA. In this state, unit horizontal scanning circuits HSR corresponding to the first to last columns of the horizontal scanning circuit 205 change their column select signals HST (HST0-HSTn) to active level. This means that the horizontal scanning circuit 205 sequentially selects the first to last columns of the pixel array GA. Thus, light signals and noise signals of pixels on the first to last columns on the first row of the pixel array GA are output from the output amplifiers 210a and 210b, respectively. After that, a unit vertical scanning circuit VSR corresponding to the second row of the vertical scanning circuit 204 changes its row select signal VST (VST1) to active level. Unit horizontal scanning circuits HSR corresponding to the first to last columns of the horizontal scanning circuit 205 change their column select signals HST (HST0-HSTn) to active level. By performing such an operation for the first to last rows, one image is output from the pixel array GA.

Figure 6:
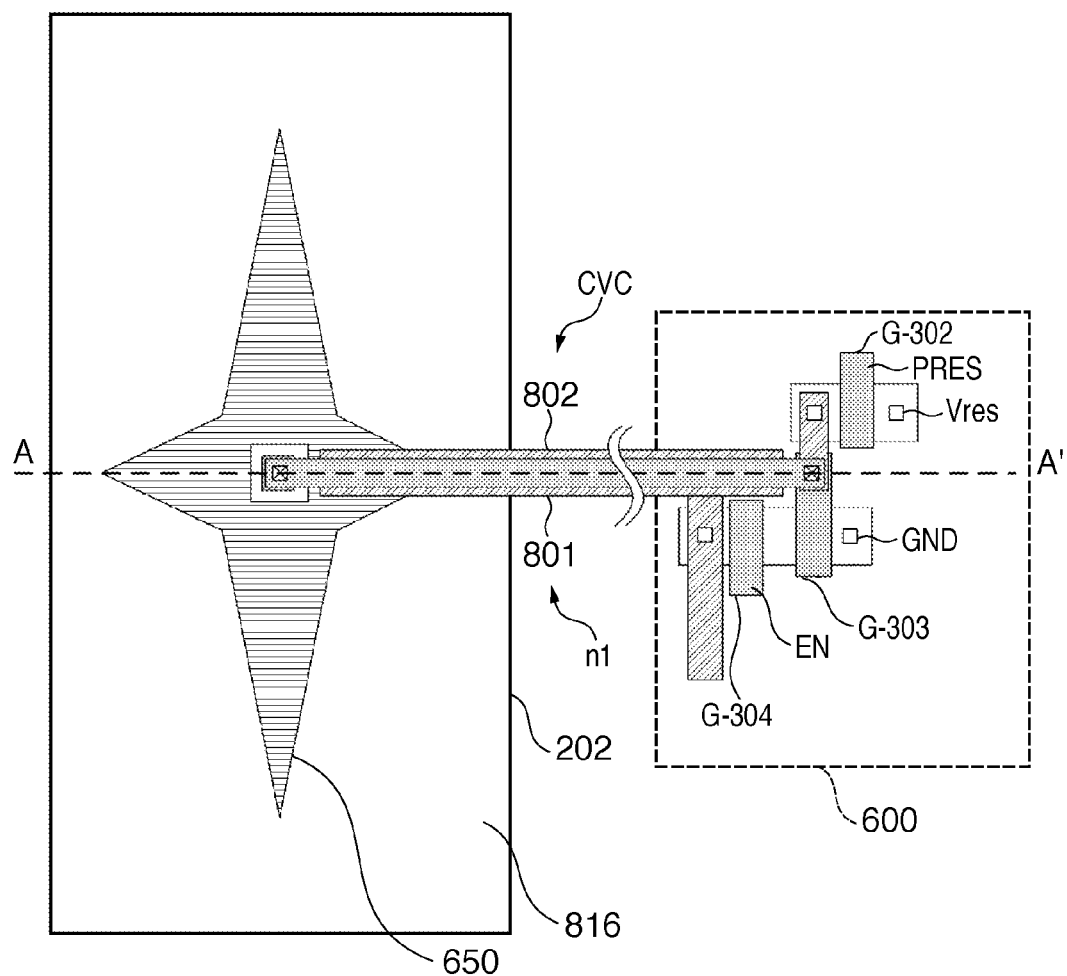
FIG. 6 illustrates an example of the arrangement of a portion of an in-pixel readout circuit and a photoelectric converter.
Figure 8:
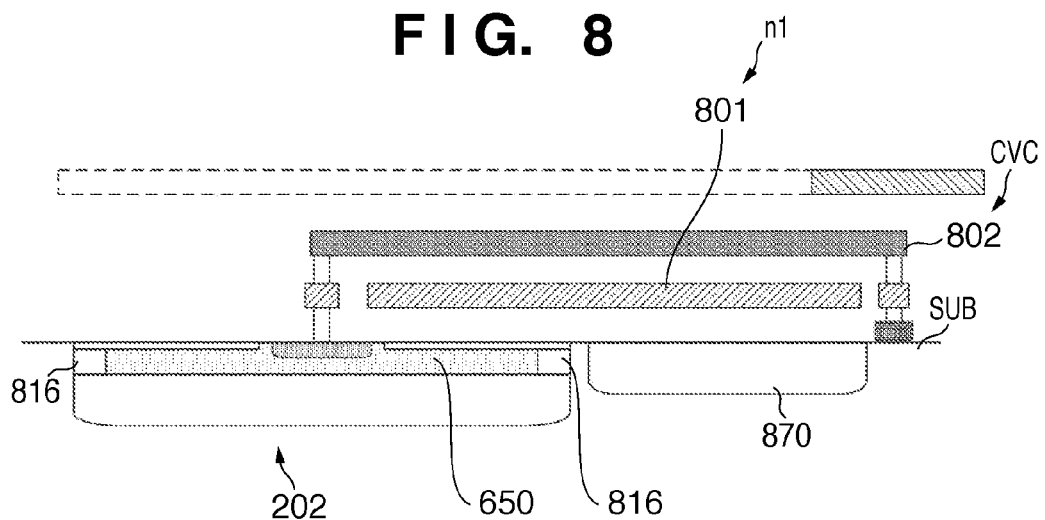
FIG. 8 illustrates a section taken along a line A-A' in FIGS. 6 and 7.

The structure of each pixel 201 will be exemplified next with reference to FIGS. 6 to 8. FIGS. 6 and 7 are plan views showing an example of the arrangement of a portion 600 of the in-pixel readout circuit 203 and the photoelectric converter 202. FIG. 6 illustrates an enlarged view of the portion 600 for the descriptive convenience. In FIG. 6, a conductive pattern 620 arranged in the third wiring layer of the pixel array GA (or the pixel 201) is not illustrated. FIG. 8 illustrates a section taken along a line A-A' in FIGS. 6 and 7. A semiconductor substrate SUB with the photoelectric converter 202 can have a well (impurity region) 870 to which a fixed electric potential (for example, a power supply potential VDD) is supplied. The well 870 is an example of a region formed from an electrical conductor or a semiconductor to which the fixed electric potential (for example, the power supply potential VDD) is supplied. The conductive pattern 620 is another example of the electrical conductor which is arranged in the pixel array GA (or the pixel 201) and to which the fixed electric potential (for example, the power supply potential VDD) is supplied.

The in-pixel readout circuit 203 includes the first amplifier circuit 310, as described above. The first amplifier circuit 310 outputs a signal corresponding to the potential of the charge-voltage converter CVC to the intermediate node (output line) n1. In the example shown in FIGS. 6 to 8, the portion 600 of the in-pixel readout circuit 203 is a portion of the first amplifier circuit 310. The charge-voltage converter CVC converts charges generated by the photoelectric converter 202 stored in a charge storage unit 650 into a signal in a voltage form. The first amplifier circuit (amplification unit) 310 amplifies the signal generated by the charge-voltage converter CVC by a positive gain and outputs the amplified signal to the node (output line) n1. The direction of change of the voltage (signal) of the charge-voltage converter CVC is the same as that of change of the voltage (signal) of the node (output line) n1. As illustrated in FIG. 8, the node (output line) n1 is arranged to shield at least part of the charge-voltage converter CVC with respect to the well 870 to which the fixed electric potential is supplied. Hence, the node (output line) n1 functions as a shielding portion that shields the charge-voltage converter CVC with respect to the well 870 to which the fixed electric potential is supplied. The shielding target of the shielding portion is the lines of electric force generated between the charge-voltage converter CVC and the well 870. This allows to reduce the effective parasitic capacitance of the charge-voltage converter CVC and improve the sensitivity. In an example, when the conductive pattern that forms the node (output line) n1 was arranged so as to shield at least part of the charge-voltage converter CVC with respect to the well 870, the sensitivity improved to 1.5 times. The first amplifier circuit 310 can be, for example, a source follower circuit, as illustrated in FIG. 3.

The node (output line) n1 includes a first conductive pattern 801 arranged in the first wiring layer to form at least part of the shielding portion. The charge-voltage converter CVC includes a second conductive pattern 802 arranged in the second wiring layer above the first wiring layer along the first conductive pattern 801.

The conductive pattern (third conductive pattern) 620 arranged in the third wiring layer above the second wiring layer has an opening portion OP at part of the region where the photoelectric converter 202 exists when viewed from the upper side, as illustrated in FIG. 7. The second conductive pattern 802 can be arranged in the opening portion OP when viewed from the upper side, as illustrated in FIG. 7. In this example, the conductive pattern 620 arranged in the third wiring layer does not exist above the charge-voltage converter CVC. For this reason, the conductive pattern that forms the node (output line) n1 does not exist above the charge-voltage converter CVC. However, if a conductive pattern to which the fixed electric potential is supplied exists above the charge-voltage converter CVC, and the pattern is not negligible, the conductive pattern that forms the node (output line) n1 is preferably arranged between that conductive pattern and the charge-voltage converter CVC as well.

Another example of the pixel 201 will be described next with reference to FIGS. 9 to 12. In the other example, the pixel 201 includes the photoelectric converter 202 and the in-pixel readout circuit 203. The in-pixel readout circuit 203 includes the charge-voltage converter CVC, a reset MOS transistor 1001, a transfer MOS transistor (transfer unit) 1002, an amplification MOS transistor 1003, and a select MOS transistor 1004. When a reset signal RES driven by the vertical scanning circuit 204 changes to active level, the reset MOS transistor 1001 resets the voltage of the charge-voltage converter CVC. When a transfer signal TX driven by the vertical scanning circuit 204 changes to active level, the transfer MOS transistor 1002 transfers the charges generated by the photoelectric converter 202 to the charge-voltage converter CVC. The amplification MOS transistor (amplification unit) 1003 forms a source follower circuit together with a current source 1005 connected to the column signal line 208 that forms a node shared by the node (output line) n1. When a row select signal SEL driven by the vertical scanning circuit 204 changes to active level to turn on the select MOS transistor 1004, the amplification MOS transistor 1003 operates as the source follower circuit together with the current source 1005. At this time, the amplification MOS transistor 1003 amplifies the signal in a voltage form from the charge-voltage converter CVC, and outputs the signal that charges in the same direction as the voltage to the node (output line) n1 and the column signal line 208. The signal output to the column signal line 208 is amplified by the output amplifier 210.

Figure 9:
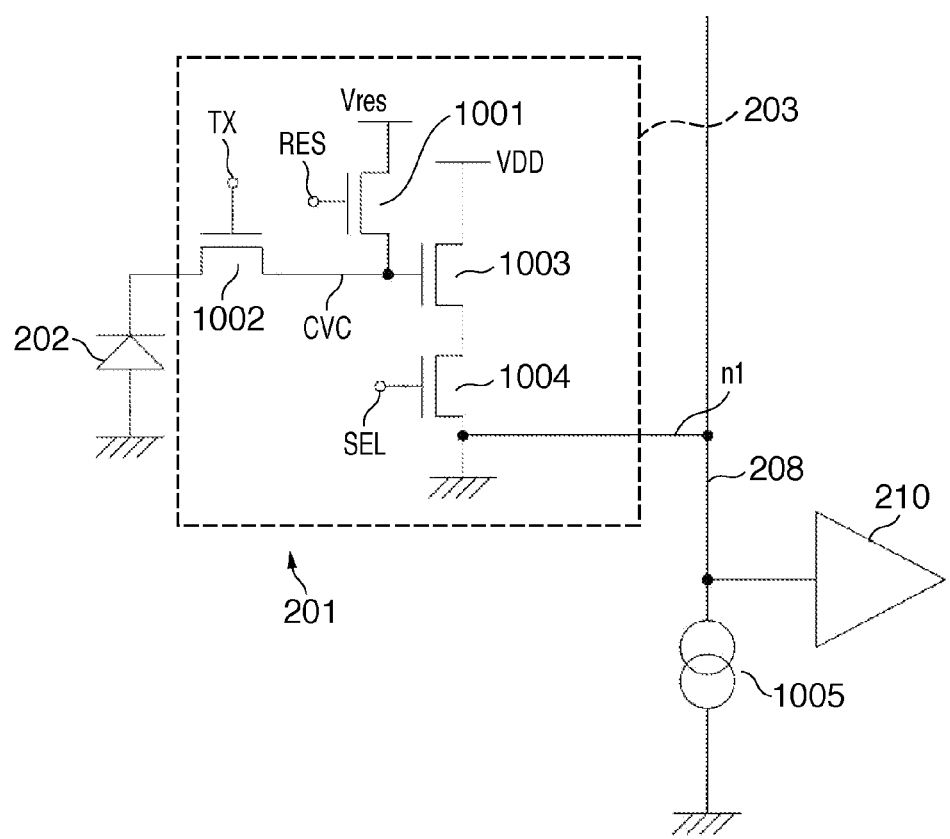
FIG. 9 illustrates another example of a pixel.
Figure 10:
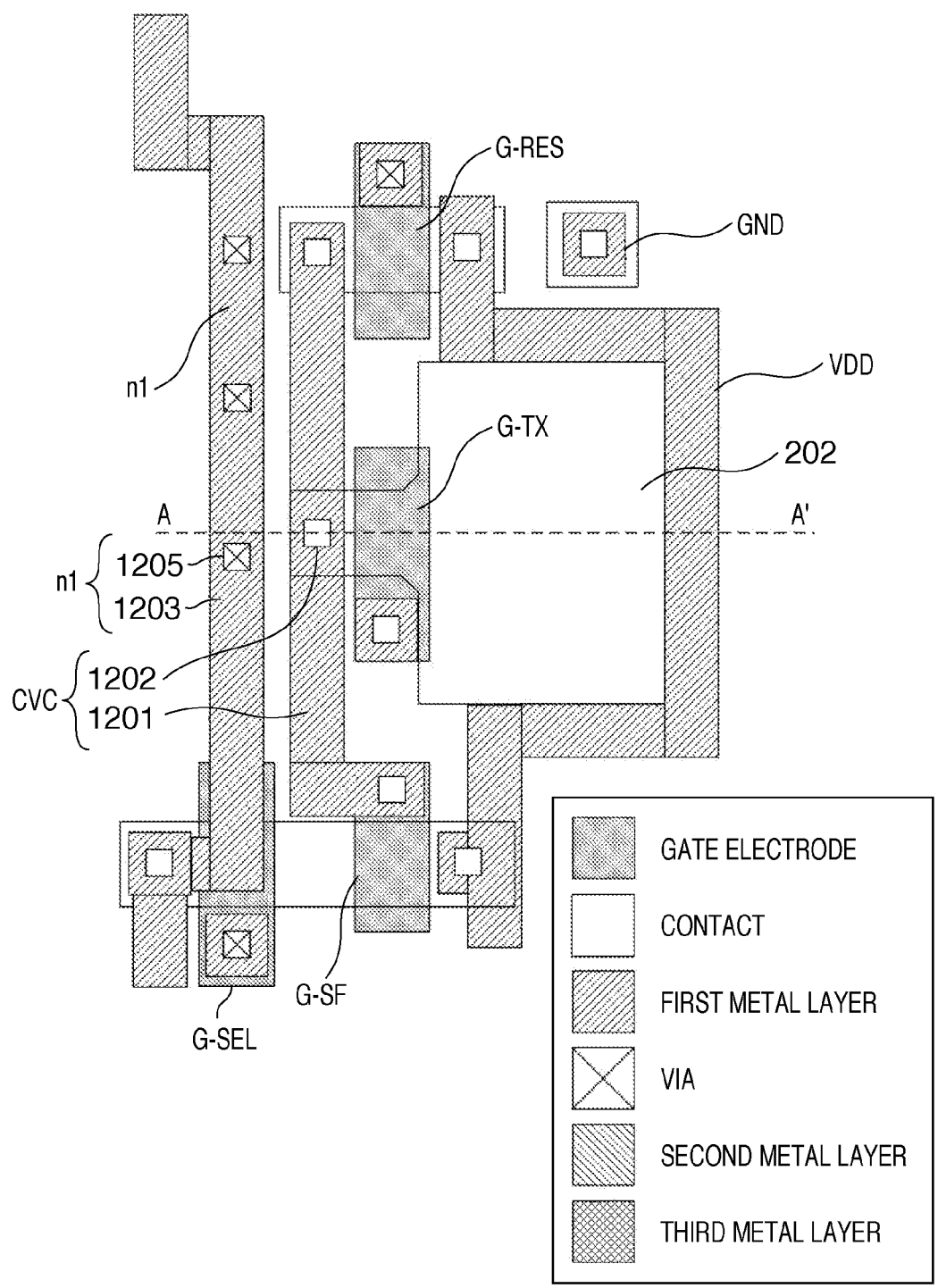
FIG. 10 illustrates an example of the arrangement of a pixel.
Figure 11:
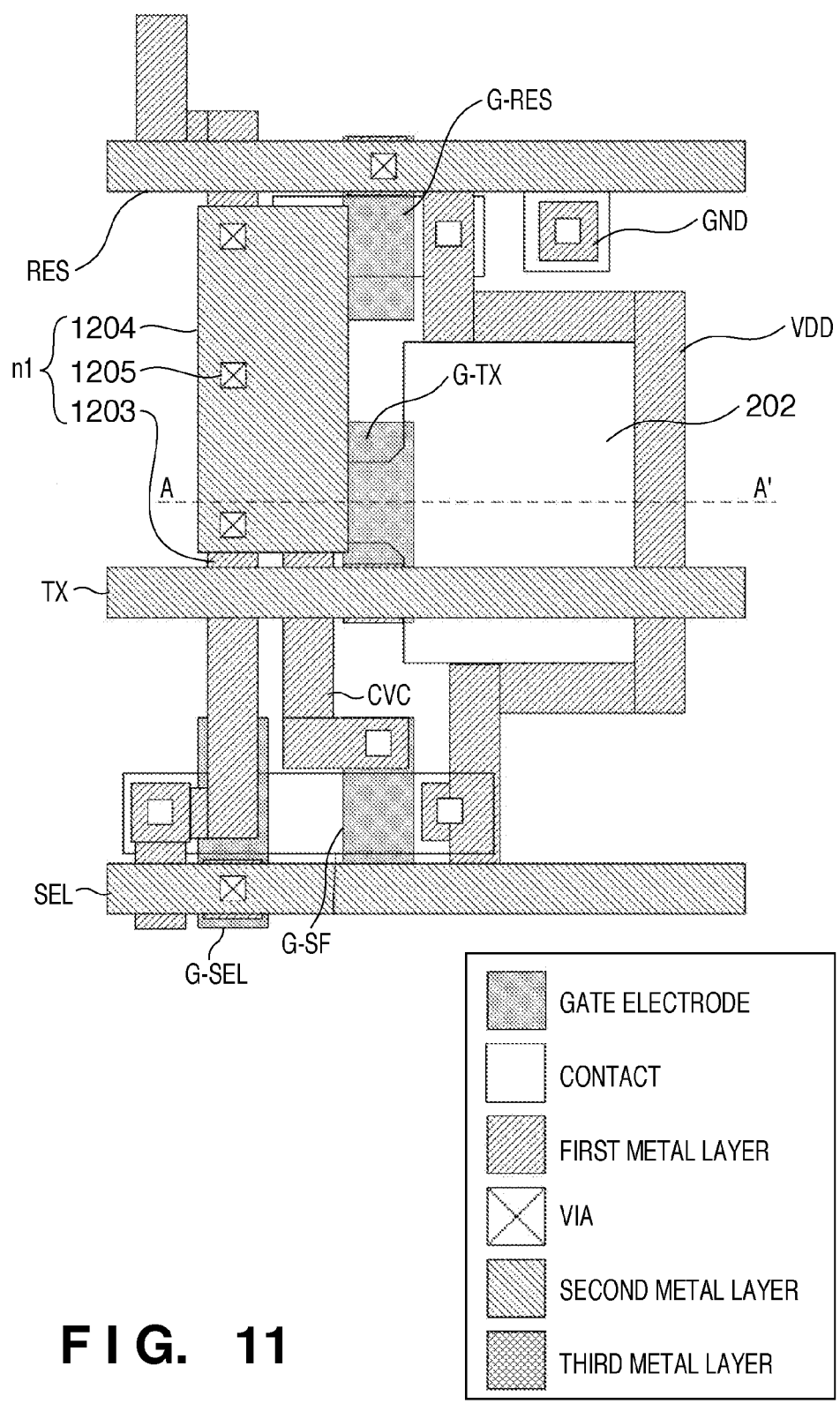
FIG. 11 illustrates an example of the arrangement of a pixel.
Figure 12:
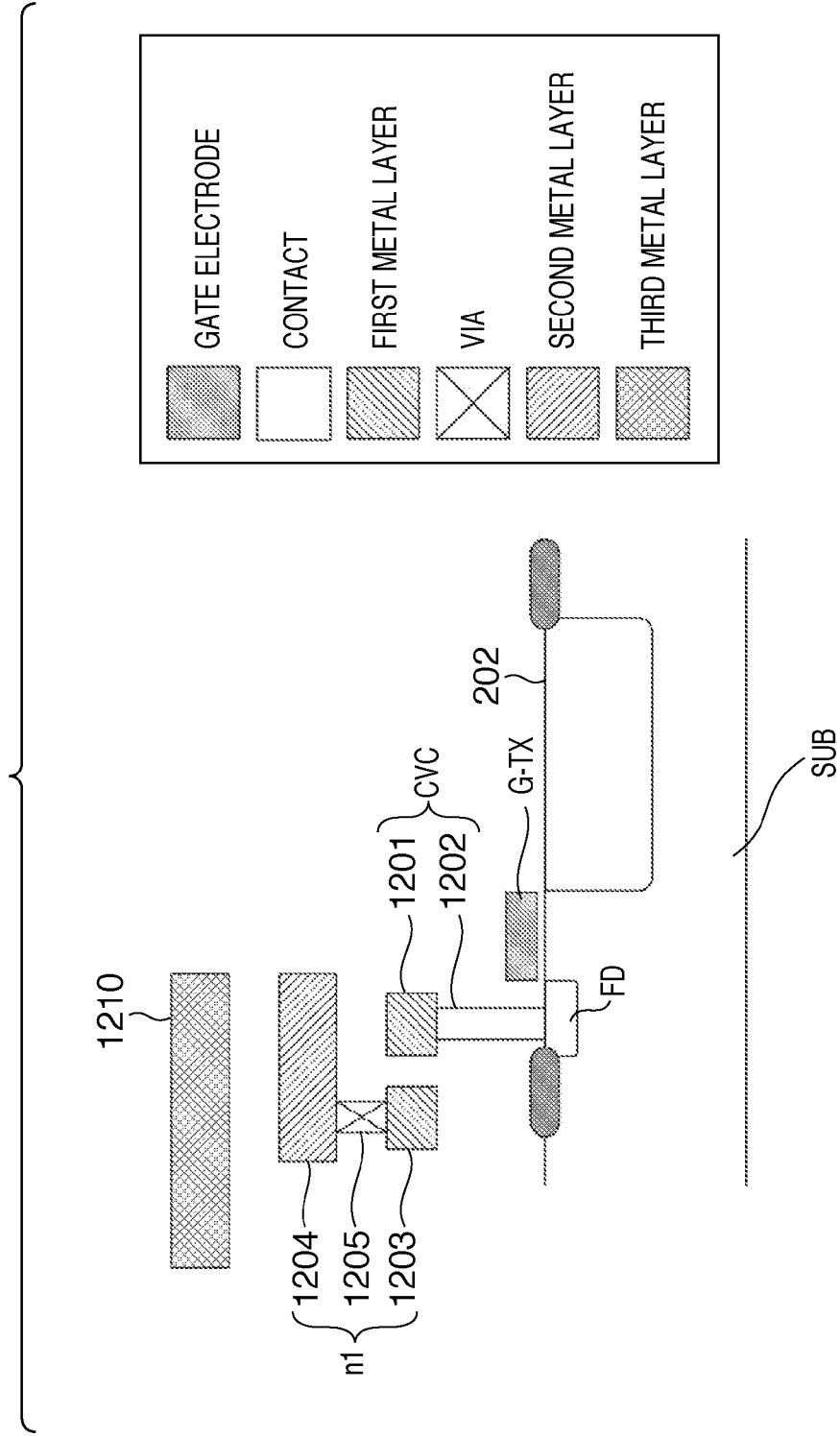
FIG. 12 illustrates a section taken along a line A-A' in FIG. 11.

FIGS. 10 and 11 illustrates an example of the arrangement of the pixel 201 shown in FIG. 9. Note that the second and third wiring layers are not illustrated in FIG. 10, and the third wiring layer is not illustrated in FIG. 11. FIG. 12 illustrates a section taken along a line A-A' in FIG. 11. Referring to FIGS. 10 to 12, G-RES denotes a conductive pattern that forms the gate of the reset MOS transistor 1001; G-TX, a conductive pattern that forms the gate of the transfer MOS transistor 1002; G-SF, a conductive pattern that forms the gate of the amplification MOS transistor 1003; and G-SEL, a conductive pattern that forms the gate of the select MOS transistor 1004.

The photoelectric converter 202 is formed in the semiconductor substrate SUB. The charge-voltage converter CVC includes a first conductive pattern 1201 arranged in the first wiring layer, and a contact plug 1202 that connects the first conductive pattern 1201 to a floating diffusion region (impurity region) FD arranged in the semiconductor substrate SUB. The output line n1 includes a second conductive pattern 1203, a third conductive pattern 1204, and a via plug 1205. The second conductive pattern 1203 is arranged in the first wiring layer and includes a portion parallel to at least part of the first conductive pattern 1201. The third conductive pattern 1204 is arranged in the second wiring layer above the first wiring layer. The via plug 1205 connects the second conductive pattern 1203 to the third conductive pattern 1204. In the pixel array GA (or the pixel 201), a fourth conductive pattern 1210 serving as an electrical conductor to which a fixed electric potential (for example, a ground potential GND) is supplied is arranged in the third wiring layer above the second wiring layer. The third conductive pattern 1204 that forms part of the node (output line) n1 is arranged to shield at least part of the charge-voltage converter CVC with respect to the fourth conductive pattern 1210 that is the electrical conductor to which the fixed electric potential is supplied, as illustrated in FIG. 12. The third conductive pattern 1204 functions as a shielding portion that shields the charge-voltage converter CVC with respect to the fourth conductive pattern 1210 that is the electrical conductor to which the fixed electric potential is supplied. The shielding target includes the lines of electric force generated between fourth conductive pattern and the charge-voltage converter CVC. This allows to reduce the effective parasitic capacitance of the charge-voltage converter CVC and improve the sensitivity.

Figure 13:
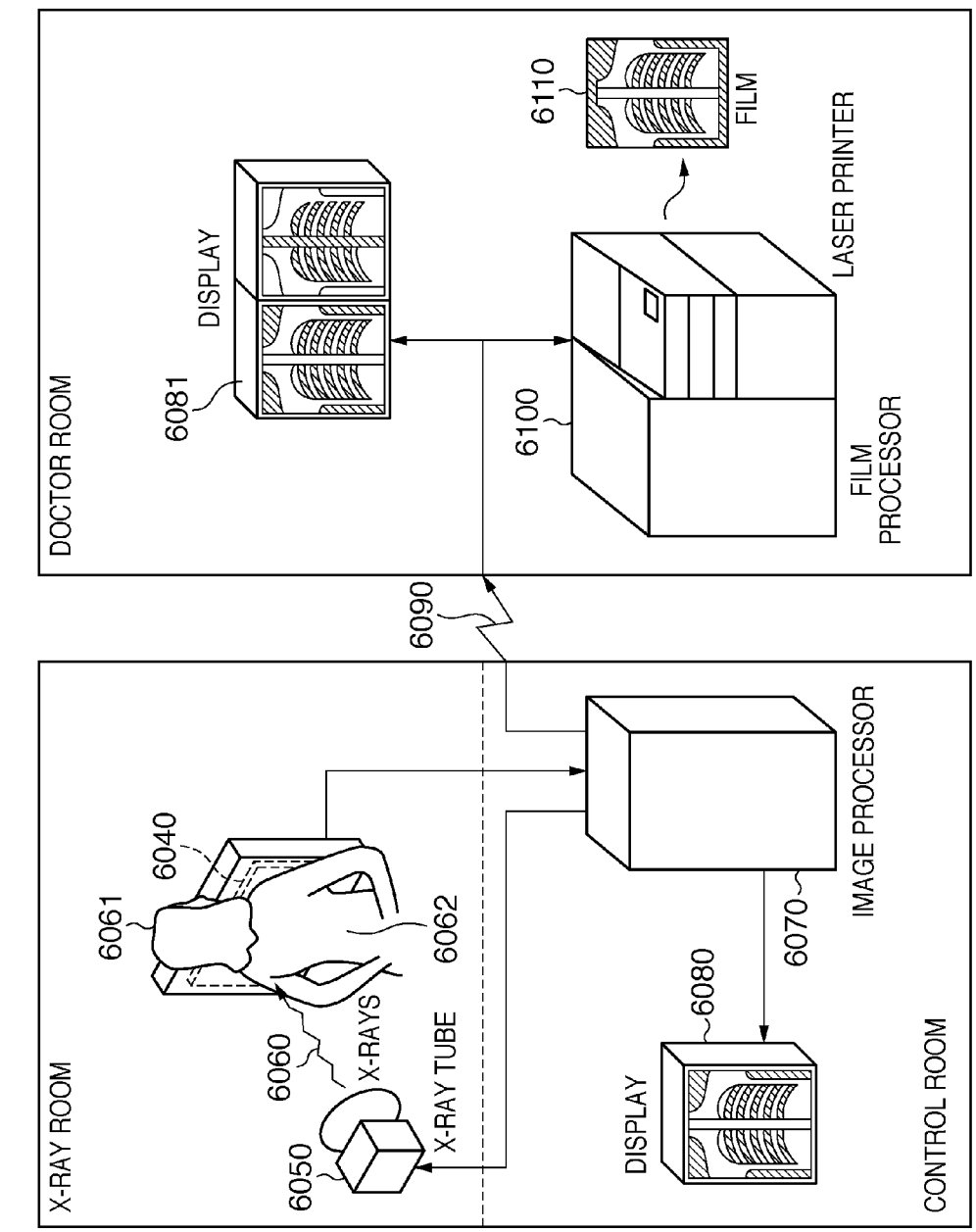
FIG. 13 illustrates a radiation imaging system.

FIG. 13 illustrates an example in which the solid-state imaging apparatus according to the present invention is applied to an X-ray diagnostic system (radiation imaging system). The radiation imaging system includes a radiation imaging apparatus 6040 and an image processor 6070 which processes a signal output from the radiation imaging apparatus 6040. The radiation imaging apparatus 6040 serves as an apparatus to which the solid-state imaging apparatus 100 mentioned above is applied and which captures radiation, as illustrated in FIG. 1B. X-rays 6060 emitted by an X-ray tube (radiation source) 6050 are transmitted through a chest 6062 of a patient or a subject 6061, and enter the radiation imaging apparatus 6040. The incident X-rays bear the information of the interior of the body of the subject 6061. The image processor (processor) 6070 processes a signal (image) output from the radiation imaging apparatus 6040, and can display the image on, for example, a display 6080 in a control room based on the signal obtained by processing.

Also, the image processor 6070 can transfer the signal obtained by processing to a remote site via a transmission path 6090. This makes it possible to display the image on a display 6081 placed in, for example, a doctor room at another site or record the image on a recording medium such as an optical disk. The recording medium may be a film 6110, and a film processor 6100 records the image on the film 6110 in this case.

The solid-state imaging apparatus according to the present invention is also applicable to an imaging system which captures an image of visible light. Such an imaging system can include, for example, the solid-state imaging apparatus 100 and a processor which processes a signal output from the solid-state imaging apparatus 100. The processing by the processor can include at least one of, for example, processing of converting the image format, processing of compressing the image, processing of changing the image size, and processing of changing the image contrast.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-155260, filed Jul. 7, 2010, which is hereby incorporated by reference herein in its entirety.

What is claimed is:

1. A solid-state imaging apparatus comprising a pixel array in which a plurality of pixels are arranged, wherein the pixel array includes a region to which a fixed electrical potential is supplied and which consists of an electrical conductor,
   wherein each of the plurality of pixels includes a photoelectric converter arranged in a semiconductor substrate, a charge-voltage converter which converts charges generated by the photoelectric converter into a voltage, a transfer unit which transfers the charges generated by the photoelectric converter to the charge-voltage converter, and an amplification unit which amplifies, by a positive gain, a signal generated by the charge-voltage converter and outputs the amplified signal to an output node,
   wherein part of a first conductive member that forms the output node is arranged, in a direction perpendicular to a surface of the pixel array, between at least part of the region and at least part of the charge-voltage converter,
   wherein the charge-voltage converter includes:
      an impurity region arranged in the semiconductor substrate,
      a second conductive pattern arranged in a first wiring layer, and
      a contact plug which connects the impurity region and the second conductive pattern,
   wherein the first conductive member includes:
      a third conductive pattern arranged in the first wiring layer and including a portion parallel to at least part of the second conductive pattern,
      a fourth conductive pattern arranged in a second wiring layer above the first wiring layer, and
      a via plug which connects the third conductive pattern and the fourth conductive pattern,
   wherein the electrical conductor includes a fifth conductive pattern arranged in a third wiring layer above the second wiring layer, and
   wherein the fourth conductive pattern is arranged between at least part of the second conductive pattern and at least part of the fifth conductive pattern.

2. The apparatus according to claim 1, further comprising:
a scintillator which converts radiation into visible light,
   wherein the pixel array is arranged to photoelectrically convert the visible light, and
   wherein the apparatus is formed as a radiation imaging apparatus.

3. A solid-state imaging apparatus according to claim 1, wherein the solid-state imaging apparatus is incorporated in an imaging system that includes a processor that processes a signal output from the solid-state imaging apparatus.

4. The apparatus according to claim 1, wherein the output node is arranged to block lines of electric force generated between the charge-voltage converter and the region.

5. The apparatus according to claim 1, wherein the amplification unit includes a source follower circuit.

6. The apparatus according to claim 1, wherein each of the plurality of pixels further includes a select switch provided in an electric path between the amplification unit and the output node.

* * * * *